United States Patent
Bahali et al.

(10) Patent No.: US 8,347,154 B2
(45) Date of Patent: Jan. 1, 2013

(54) USE OF HASHING FUNCTION TO DISTINGUISH RANDOM AND REPEAT ERRORS IN A MEMORY SYSTEM

(75) Inventors: Sumanta K. Bahali, Cary, NC (US); Tu T. Dang, Cary, NC (US); Michael C. Elles, Apex, NC (US); Juan Q. Hernandez, Garner, NC (US); Dwayne A. Lowe, Durham, NC (US); Challis L. Purrington, Raleigh, NC (US); Michael L. Scollard, Raleigh, NC (US); Ivan R. Zapata, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 281 days.

(21) Appl. No.: 12/887,184

(22) Filed: Sep. 21, 2010

(65) Prior Publication Data

US 2012/0072786 A1 Mar. 22, 2012

(51) Int. Cl.
*G06F 11/00* (2006.01)
(52) U.S. Cl. ............... 714/704; 365/200; 365/225.7; 714/723
(58) Field of Classification Search ............... 714/704, 714/723; 365/200, 225.7
See application file for complete search history.

(56) References Cited

U.S. PATENT DOCUMENTS

| | | | | |
|---|---|---|---|---|
| 4,369,510 A * | 1/1983 | Johnson et al. | ............... | 714/49 |
| 4,792,954 A * | 12/1988 | Arps et al. | ............... | 714/799 |
| 6,480,982 B1 * | 11/2002 | Chan et al. | ............... | 714/764 |
| 6,539,506 B1 * | 3/2003 | Lammers et al. | ............... | 714/719 |
| 6,976,197 B2 | 12/2005 | Faust et al. | | |
| 2007/0255847 A1 * | 11/2007 | Smith | ............... | 709/231 |
| 2007/0283193 A1 | 12/2007 | Lewis et al. | | |
| 2008/0181035 A1 * | 7/2008 | Kawasumi | ............... | 365/200 |
| 2008/0301530 A1 | 12/2008 | Spanel et al. | | |
| 2009/0106633 A1 * | 4/2009 | Fujiwara et al. | ............... | 714/785 |
| 2010/0269018 A1 * | 10/2010 | Clark et al. | ............... | 714/763 |

* cited by examiner

*Primary Examiner* — Guy Lamarre
(74) *Attorney, Agent, or Firm* — Cynthia G. Seal; Jeffrey L. Streets

(57) ABSTRACT

One embodiment provides an error detection method wherein single-bit errors in a memory module are detected and identified as being a random error or a repeat error. Each identified random error and each identified repeat error occurring in a time interval is counted. An alert is generated in response to a number of identified random errors reaching a random-error threshold or a number of identified repeat errors reaching a repeat-error threshold during the predefined interval. The repeat-error threshold is set lower than the random-error threshold. A hashing process may be applied to the memory address of each detected error to map the location of the error in the memory system to a corresponding location in an electronic table.

20 Claims, 2 Drawing Sheets

US 8,347,154 B2

USE OF HASHING FUNCTION TO DISTINGUISH RANDOM AND REPEAT ERRORS IN A MEMORY SYSTEM

BACKGROUND

1. Field of the Invention

The present invention generally relates to a computer memory system, and more specifically relates to error detection and predictive failure analysis in a memory system.

2. Background of the Related Art

Computer system memory includes both long-term (non-volatile) and short-term (volatile) memory devices. Long-term memory devices, such as a hard disk drive (HDD), are capable of retaining software and data even in a powered-off state. Short-term memory devices, such as a Dual In-Line Memory Module (DIMM), are capable of retaining instructions and data while in a powered-on state. Software instructions and data may be stored indefinitely in long-term memory and loaded on an as-needed basis to short-term memory for execution by a processor. The results from executing the instructions, such as processed data, may also be temporarily stored in the short-term memory for continued access during a powered-on computing session, or in long-term memory for access and processing in a subsequent computing session.

Errors can occur in a DIMM, which can affect the performance and reliability of a memory system. One type of DIMM error is the Single Bit Error (SBE). Random power and ground noise in close proximity to high-efficiency switch regulators is one cause of SBEs. The increasingly tighter timing requirements in a memory system is another contributing factor to SBEs. DIMMS are also incorporating increasingly larger memory-cell densities, which leads to a higher bit error rate (BER) per DIMM. Computer systems are incorporating an increasing density of DIMMs per system, which may also lead to a correspondingly higher error rate.

BRIEF SUMMARY

One embodiment of the present invention provides a method in which single-bit errors in a memory module are detected. Each single-bit error is identified as a random error or a repeat error. Each identified random error and each identified repeat error occurring in a time interval is counted. An alert is generated in response to a number of identified random errors reaching a random-error threshold or a number of identified repeat errors reaching a repeat-error threshold during the time interval. The repeat-error threshold is lower than the random-error threshold.

Another embodiment of the invention provides a memory system. A memory controller includes error detection control logic for detecting single-bit errors in the memory module. A random-error counter is included for counting random errors occurring during a time interval. A repeat-error counter is included for counting repeat errors occurring during the time interval. A threshold comparator is provided for comparing the random-error counter against a random-error threshold and for comparing the repeat-error counter against a repeat-error threshold. The repeat-error threshold is smaller than the random-error threshold. An alert generator is configured to generate an alert in response to the random-error counter reaching the random-error threshold or the repeat-error counter reaching the repeat-error threshold during the time interval.

DETAILED DESCRIPTION

Embodiments of the present invention include a system and method for performing predictive failure analysis (PFA) in a memory system. Each single bit error (SBE) may now be identified as either a random error, which is determined to occur no more than once at a particular memory address or block of memory addresses during a predefined time interval, or a repeat error, which is determined to occur more than once at a particular memory address or at a particular block during the predefined time interval. The numbers of random errors and repeat errors occurring within a predefined time interval may then be compared against different thresholds for the purpose of generating PFA alerts. More particularly, a higher threshold may be set for SBE that are identified as random errors than for SBE that are identified as repeat errors, because random errors are significantly less likely than repeat errors to impact memory performance. Random errors are also less likely to propagate to uncorrectable errors, the occurrence of which is very disruptive to the operation of a memory system. Distinguishing random errors from repeat errors in this manner will therefore allow more serious repeat errors in a DIMM to be identified, while preventing a DIMM from being unnecessarily or prematurely flagged as a bad DIMM when it is experiencing an acceptable rate of merely random errors.

In one embodiment discussed below, a hashing process is used to reduce the amount of memory and number of compute cycles required to track each location in system memory where errors recur. The hashing process may be applied to the memory address at which an SBE is identified to determine the table location at which the SBE is to be logged. Memory addresses may be grouped as blocks, wherein every memory address in a given block produces the same hash sum when the hashing function is applied. Then, a corresponding error status field as small as a one-bit signature may be used to track whether a first or subsequent error has resulted at that memory address or block of memory addresses. As few as two counters may be required for the entire system, with one counter used to track the total number of SBEs identified as random errors and a second counter used to track the total number of SBEs identified as repeat errors in the memory system. Parameters such as the random error threshold, the repeat error threshold, the time interval, the size of the hash table, the size of each block of memory addresses, and the size of each error status field may be independently adjusted to tune the memory system as desired.

Figure 1:
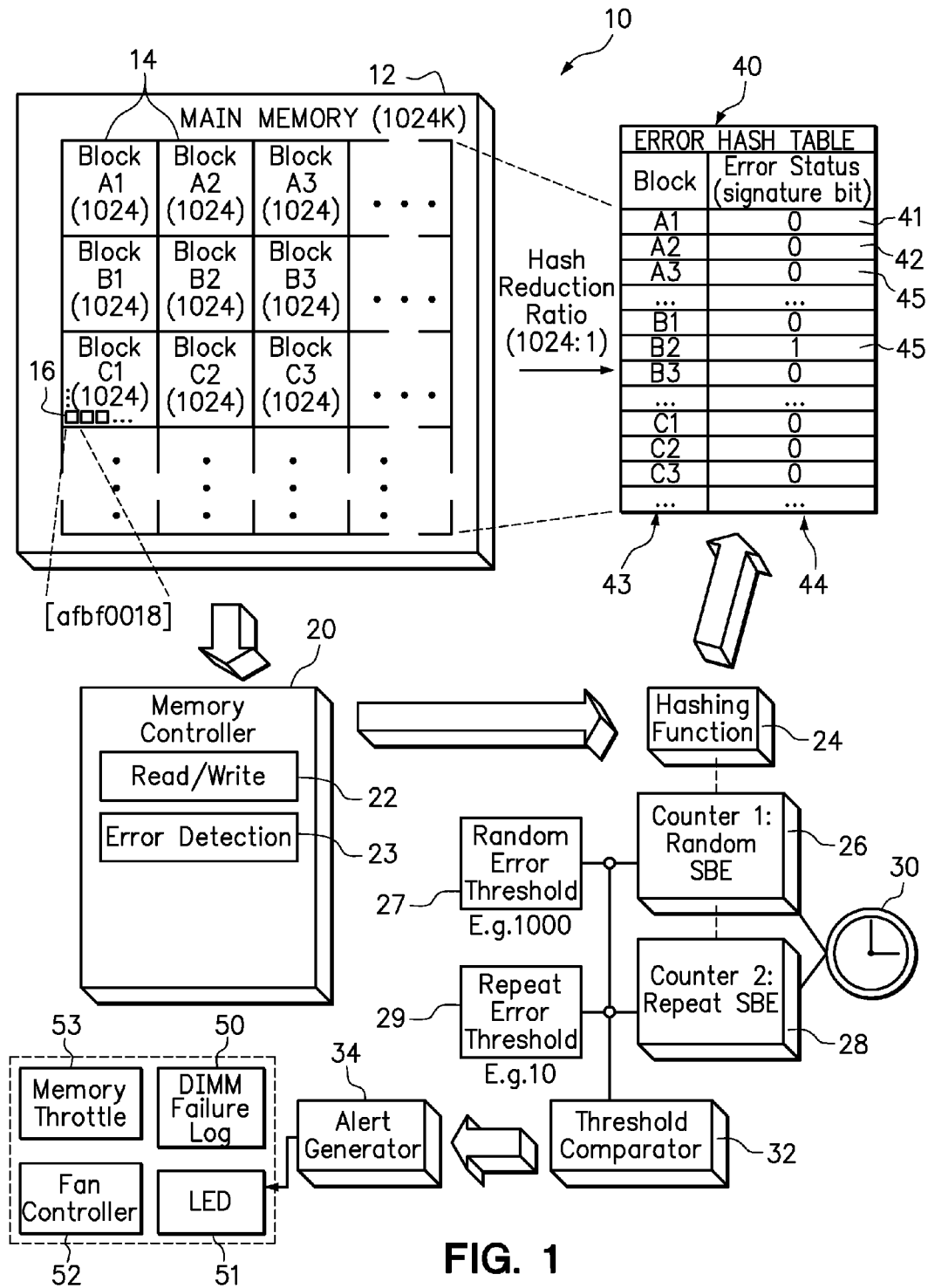
FIG. 1 is a schematic diagram of a computer memory system on which predictive failure analysis (PFA) is implemented according to an embodiment of the invention.

FIG. 1 is a schematic diagram of a computer memory system 10 on which predictive failure analysis (PFA) is implemented according to an embodiment of the invention. The memory system 10 may be provided on a blade server of a rack-mounted computer system, for example. The memory system 10 includes main memory 12 having one or more dual, in-line memory module (DIMM), such as may be provided on the system board of a blade server. A memory controller 20 contains read/write control logic 22 for reading and writing data to main memory 12 and error detection control logic 23 for identifying and correcting DIMM errors. DRAM (Dynamic Random Access Memory) chips included with the DIMMs of main memory 12 may include memory bits (not shown) dedicated to error correction. The memory controller 20 may use these error detection bits to record parity or to use an error-correcting code (ECC) to detect all single-bit errors. The error detection control logic may include an SEDDED ("single error detection, double error detection") code to detect and correct single-bit errors and, using an extra parity bit, to optionally detect double-bit errors.

The main memory 12 may contain many thousands or millions of discrete storage locations at which data may be stored. The main memory 12 is partitioned into blocks 14, with each block 14 containing only a subset of the total number of storage locations available in main memory 12. Each storage location has a unique memory address, such that each block 14 contains a subset of the total number of unique memory addresses available in main memory 12. One example of a storage location is generally indicated at 16, having an example memory address of "afbf0018." An eight-character address such as this one may be represented using a byte of storage. The memory controller 20 included with the memory system 10 may read and write to specific storage locations by referencing the corresponding memory addresses. Each block is typically a physical grouping of memory addresses. The blocks 14 are diagrammed, for purpose of discussion, as an organized array of square or rectangular blocks 14, with each block 14 identified in the figure by a row letter (A, B, C, etc.) and a column numeral (1, 2, 3, etc.). However, the blocks 14 need not have the specific physical grouping shown.

Each block 14 may include any number of storage locations each having a unique memory address. FIG. 1 provides an example wherein the main memory 12 has a total of 1024× 10^3 (i.e., 1024 k) storage locations at 1024 k respective memory addresses. The 1024 k storage locations in main memory 12 may be partitioned into one thousand blocks 14, such that each block 14 has 1024 storage locations. It is also within the scope of the invention to structure the main memory 12 with as few as one storage location per block 14 (i.e. with each block 14 representing a single address in main memory 12). However, tracking the occurrence of SBE at each memory address can be extremely memory-intensive and CPU-intensive. As further explained below, grouping multiple memory addresses into each block 14 in this particular embodiment allows PFA to be performed more efficiently.

An electronic table 40 is provided for tracking single-bit errors (SBE) detected in main memory 12. The table 40 may be a subset of main memory 12 that is readable and writeable by the system's memory controller 20. Application-specific system code could be included with the memory controller 20 to access the table 40 and perform PFA functions. Alternatively, hardware and software elements external to the main memory 12 could be included to perform these functions. The storage locations in each block 14 of main memory 12 are mapped according to their memory addresses to a corresponding location in the electronic table 40. In this embodiment, the table 40 includes a separate record corresponding to each block of memory addresses, such that each address within a particular block is mapped to the same location in the table 40. Specifically, each block along with the memory addresses included in that block are mapped to a row of the table 40, wherein each row contains a different record. For example, block A1 and each of the 1024 memory addresses contained within the block A1 are mapped to a corresponding first row 41 of the table 40, Block A2 and its 1024 addresses are mapped to a corresponding second row 42 of the table 40, and so forth. A first column (block listing column) 43 lists the blocks 14 in main memory 12. A second column (error tracking column) 44 of the table is used to log the occurrence of SBE as a one-bit signature 45.

The memory addresses of each block could be mapped to the table 40 in a variety of ways. In this embodiment, the memory addresses are efficiently mapped to the table 40 by applying a hashing function 24 to the memory address. The hashing function 24 is selected so that each memory address in a given block 14 yields the same hash sum when the hashing function 24 is applied. The hashing function 24 provides a logical grouping to each block 14, wherein each memory address in a particular block 14 has the same hash value when the hashing function 24 is applied. In the illustrated example, the hashing function has a hash reduction ratio of 1024:1. Each of the 1024 memory addresses in Block A1 yields the same hash sum when the hashing function 24 is applied. Each of the 1024 memory addresses in Block A2 yields another hash sum distinct from the hash sum computed for the 1024 address of Block A1, and so forth. The table 40 thus includes 1000 rows, one for each block 14. When an error is detected at a particular storage location in main memory 12, the hashing function 24 is applied to the memory address of that storage location to determine which row of the table 40 to log the error in the error tracking column 44.

In one embodiment, PFA may be performed on the main memory 12 by identifying SBEs and tracking the locations of the SBEs to identify the SBEs as either random or repeat errors. For the purpose of this disclosure, errors that do not occur more than once at any particular address or block of addresses over a specified time interval may be treated as random errors. Errors that do occur more than once at a particular address or block of addresses may be treated as repeat errors. In another embodiment, only those errors that recur at a particular address may be treated as a repeat error, and an unexpectedly high recurrence of errors within a block of memory addresses may be used as an indicator of a probable repeat error at a particular memory address within that block. It is within the scope of the invention to track SBE at each and every memory address in main memory 12, to specifically determine whether a particular memory address experiences a repeat error. However, by grouping the memory addresses into blocks 14, the occurrence of errors may be tracked at the block-level rather than at the level of individual memory addresses, to provide a more efficient way to track and categorize SBE as either random or repeat errors. The highest level of resolution in terms of distinguishing random errors from repeat errors may be provided by treating each individual memory address as a separate block. However, tracking the error rate at each memory address can be very memory-intensive and CPU-intensive. A greater level of efficiency having an acceptable degree of resolution may be obtained by instead grouping the memory addresses into the blocks 14 and monitoring the occurrence and recurrence of SBEs at the block level.

In this embodiment, a first counter (random error counter) 26 is provided to count each SBE identified as a random error. A second counter (repeat error counter) 28 is provided to count each SBE identified as a repeat error. A timer function 30 is used to time successive time intervals of a predefined duration. At the beginning of each time interval, the table 40 is initialized by resetting all of the signature bits 45 in the error tracking column 44 to zero. During each successive time interval, SBE are detected and logged in the error tracking column 44 of the table 40 according to which block 14 each SBE occurred. Using the error tracking column 44, the first error occurring in any given block may be treated as a random error, and any recurring error in that block during that particular time interval is treated as a repeat error. (In a variation to this approach, rather than treating a first error as a random error, the determination of whether an error is a random or repeat error may be made upon the conclusion of each predefined time interval. The occurrence of one and only one error in a given block during the interval may be treated as a random error and the occurrence of more than one error in a given block may be treated as a repeat error.) The random and repeat errors are counted on the respective counters 26, 28. A threshold comparator 32 compares the random error counter 26 to a first threshold (random error threshold) 27 and compares the repeat error counter 28 to a second threshold (repeat error threshold) 29. An alert generator 34 is configured to generate a PFA alert if, during any predefined time interval, the number of identified random errors reaches the random error threshold 27 or the number of identified repeat errors reaches the repeat error threshold 29.

The alert generator 34 may be used to trigger a remedial action such as to flag a DIMM as bad and automatically take the DIMM off-line. Alternative or additional actions taken in response to a PFA alert may include, for example, logging the location of the DIMM suspected as failing in a DIMM failure log 50 to aid in the subsequent repair action of that DIMM. In another action, an LED 51 or other visual indicator adjacent to the DIMM in question could also be turned on in response to a PFA alert. Still further, a fan controller 52 could increase cooling in response to the PFA alert, such as to cool elevated temperatures that may have contributed to the failed DIMM. Memory throttling control logic 53 could also be included to reduce DIMM performance in response to a PFA alert. The error detection control logic 23 could also start more frequent scanning to detect and correct errors, such as through the use of memory scrubbing.

The repeat error threshold 29 is preferably set lower than the random error threshold 27. Setting the repeat error threshold significantly lower than the random error threshold provides a PFA having a greater tolerance for random errors than for repeat errors. An example is given in the figure wherein the random error threshold 27 is set to 1000 whereas the repeat error threshold 29 is set to only 10. In this example, the random error threshold 27 is thus ten times the magnitude of the repeat error threshold 29. The random and repeat error thresholds 27, 29 and hash reduction ratio (discussed above) may be a function of, for example, the amount of memory governed by a stated memory performance requirement or a Reliability, Availability and Serviceability (RAS) requirement.

The signature bit 45 provided in the error tracking column 44 of each row (record) is a one-bit signature in this embodiment. One bit is the smallest available unit of storage, which can have one of two mutually-exclusive binary values, such as a "0" or a "1." The use of a one-bit signature desirably minimizes the amount of storage required to indicate an error status, while providing a limited amount of information about the error status of a particular block. When the error detection control logic 23 detects an SBE, the hashing function is applied to the memory address of the SBE to determine which row of the table 40 to log the SBE. If the signature bit 45 in that row is currently a "0," then the signature bit is toggled from a "0" to a "1" to log the error and the random error counter 26 is incremented. If a subsequent SBE occurs within the same block 14 during that same time interval, the memory controller 20 determines from the "1" value of the signature bit 45 that at least one error has previously occurred in that block, and increments the repeat error counter 28. The signature bit retains the value of 1 for the duration of the time interval, so that the repeat error counter 28 will be incremented for every SBE that occurs at that same block during that particular time interval. Meanwhile, SBE that occur only once at other blocks 14 during that time interval will be counted as random errors by the random error counter 26. In this particular embodiment, the total number of SBE identified as random errors and the total number of SBE identified as repeat errors are counted, without specifying how many repeat errors occur at each block.

In the embodiment of FIG. 1, each block 14 may have many memory addresses (e.g. 1024 addresses per block in the example), but the signature bit 45 only includes one bit. Thus, the value of the signature bit 45 in the error tracking column 44 only indicates whether an SBE previously occurred within a given block 14 during the present time interval, without specifying the specific memory address at which the SBE previously occurred. However, the count of repeat errors at each block 14 still provides information useful for PFA, because a bad memory address or a bad cluster of memory addresses within a given block may result in a disproportionately large error count in that block. The value of the repeat error threshold 29 may be selected to indicate, within a desired level of certainty, that a faulty memory address is present within that block.

The size of each field in the error tracking column 44 is one parameter that may be selected to tune the performance of a PFA process on the memory system 10. The size of each field in the error tracking column 44 may be increased from the one-bit signature 45 shown to a multi-bit field to allow for more specific information to be logged. For example, if the size of each field in the error tracking column 44 is increased from a single bit to a full byte of storage, each field in the error tracking column 44 could be used to count the number of errors occurring at each block 14, and not just the total number of errors occurring in the memory system 10. Counting the number of errors at each block 14 would provide additional information that may be used in analyzing the SBE occurring in main memory 12. An alert may be generated to indicate a block having a disproportionately higher number of repeat errors. For example, if a total of ten repeat errors occur in the memory system 12 during one time interval, the occurrence of ten repeat errors in one block could be indicative of a more serious problem than one repeat error at each of ten different blocks. Another threshold, could be used to trigger an alert in response to the number of repeat SBE in a particular block.

The number of memory addresses grouped into each block 14 is another parameter that may be selected to tune the performance of a PFA process on the memory system 10. Increasing the number of memory addresses per block 14 reduces the size of the table 40 and increases the speed of a PFA process in the memory system 10. Conversely, reducing the number of memory addresses per block 14 increases the table size but better distinguishes random errors from repeat errors. At one extreme, reducing the size of each block 14 to a single memory address would effectively allow the memory system 10 to identify a repeat error occurring at any specific memory address. However, doing so would increase the size of the table 40 by requiring as many fields in the error tracking column 44 as the number of unique memory addresses in main memory 12. The desired balance of efficiency and resolution may be obtained according to how many memory addresses are grouped into each block 14.

The random error threshold 27 and the repeat error threshold 29 are two more parameters that may be selected to tune the performance of a PFA process on the memory system 10. The larger each threshold 27, 29 is, the more tolerant the PFA process will be of the respective error types. However, because random errors may be regarded as less likely to result in any sort of catastrophic failure in the memory system 10, the random error threshold 29 may be set many times larger than the repeat error threshold 27.

The time interval measured by the timer function 30 is yet another parameter that may be used to tune the performance of a PFA process on the memory system 10. For example, a longer time interval may give a more complete indication of any tendencies for errors to occur in the various blocks of the memory system 10. However, a shorter time interval may be selected so that the system 10 is faster to respond to errors and generate any PFA alerts that may be warranted.

Furthermore, the parameters of field size, block size, random error threshold 27 and repeat error threshold 29, and time interval influence one another, and may be adjusted in tandem to achieve the desired tuning. For example, if the block size is reduced to include fewer memory addresses per block, the system 10 will be better able to distinguish between random and repeat errors. Consequently, the repeat error threshold 29 may be reduced along with a reduction in block size, since the number of repeat errors counted in a reduced-size block are more likely to come from a single memory address or a smaller group of memory addresses Likewise, if a longer time interval is selected, correspondingly larger values of the random error threshold 27 and repeat error threshold 29 may be selected.

The example of FIG. 1 is selected for ease of discussion using a convenient number of 1000 memory blocks. In another, more practical example, a 4.29 GigaByte (GB) DIMM could be divided into 16,384 blocks, with each block containing 262,144 (4.29 GB/16,384) bytes). To track 16,384 blocks using a one-bit-per-block algorithm would only require a 2,048 (16,384/8) byte table. This would yield a hash ratio of 2,097,152 (4.29 GB/2048 Bytes) to 1. This is a relatively large hash ratio, yielding a correspondingly small table that could be very efficiently managed. The effectiveness of this large hash ratio in this example should be more than sufficient for distinguishing random errors from repeat errors.

Figure 2:
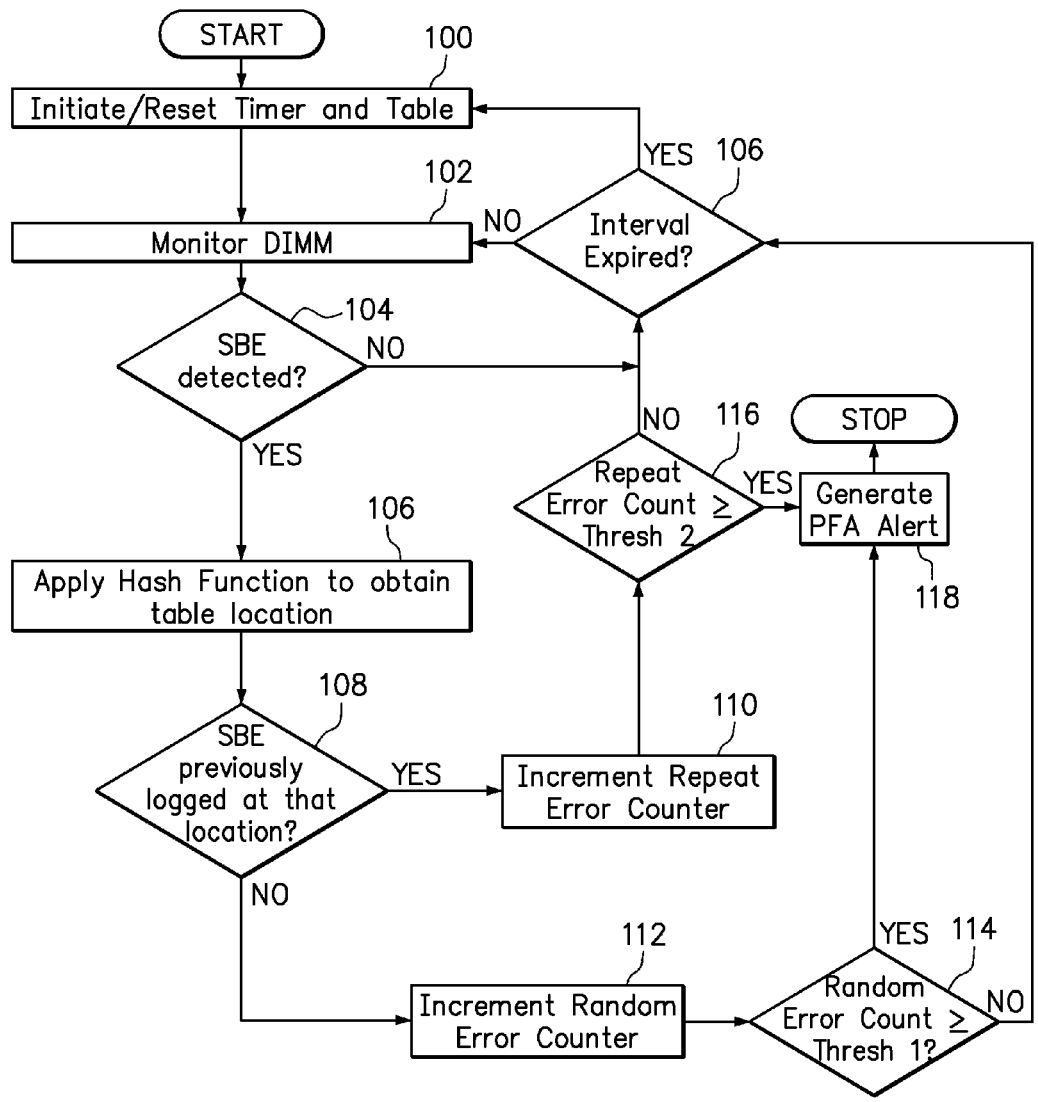
FIG. 2 is a flowchart generally outlining a PFA process that may be performed in a memory system.

FIG. 2 is a flowchart generally outlining a PFA process that may be performed in a memory system, including but not limited to the memory system 10 of FIG. 1. Step 100 involves initiating or resetting a timer and a table. The table is an electronic table, an example of which is the table 40 of FIG. 1. The table includes an error tracking field for each block of memory addresses to track the SBE identified at that block. With each iteration of step 100, the error tracking fields in the table may all be reset to a zero or null value. The timer will be used to time successive intervals during which SBE are identified and counted. The timer will also initially be set to zero with each iteration of step 100.

During step 102, one or more DIMM of a memory system are monitored for errors, including single-bit errors (SBE). Conditional step 104 is responsive to the detection of an SBE, while conditional step 106 is responsive to whether the current interval has expired. Per steps 102, 104, and 106, the DIMM is continuously monitored for SBE for the duration of the time interval. If an SBE is detected per step 104 at any time during the current interval, then the process proceeds to step 108, wherein a hashing function is applied to the memory address at which the SBE was identified to determine the location in the table at which to record the SBE. For example, the hashing function may be selected to produce the same hash sum when applied to any memory address in a given block. The table location may be a particular row for that block.

In conditional step 108, a field within the row or other table location corresponding to the block may be referenced to determine if any SBE were previously logged at that table location during the present time interval. If one or more SBE was previously logged at that table location during the present time interval, a repeat error counter may be incremented per step 110. The repeat error counter may be generalized to the memory system, if only one repeat-error counter is used for the entire memory system, or may be specific to the block if a separate counter is provided for each block. If an SBE was not previously logged at that table location in step 108, however, then a random-error counter may be incremented instead per step 112. The random-error counter is generalized to the entire memory system.

The SBE may then be compared against the relevant thresholds. If the SBE was identified as a random error per step 108 to cause the random error counter to be incremented per step 112, then the random-error counter is compared against a random error threshold (Thresh 1) according to conditional step 114. If the SBE was instead identified as a repeat error per step 108 to cause the repeat error counter to be incremented per step 110, then the repeat error is compared against a repeat-error threshold (Thresh 2) according to conditional step 116. If either the random error counter reaches the random error threshold per step 114 or the repeat error counter reaches the repeat error threshold per step 116, an alert is generated per step 118.

If neither threshold has been exceeded, the process returns to conditional step 106 to determine whether the present time interval has expired. If the interval has not yet expired, then the process continues of monitoring the one or more DIMMs (step 102), identifying the occurrence of SBE (step 104), logging any repeat errors (step 110) or random errors (step 112), and comparing the SBE counters against the respective thresholds (steps 114 and 116). Once the expiration of the present interval has been detected per step 106, the process returns to step 100, wherein the timer and table are reset as described above.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
   detecting single-bit errors in a memory module;
   identifying each single-bit error as a random error or a repeat error;
   counting each identified random error and each identified repeat error occurring in a time interval; and
   generating an alert in response to a number of identified random errors reaching a random-error threshold or a number of identified repeat errors reaching a repeat-error threshold during the time interval, wherein the repeat-error threshold is lower than the random-error threshold.

2. The method of claim 1, further comprising:
identifying each first occurrence of a single-bit error among a subset of memory addresses during the time interval as a random error; and
identifying each subsequent occurrence of a single-bit error among the subset of memory addresses during the same time interval as a repeat error.

3. The method of claim 1, further comprising:
identifying the occurrence of one and only one single-bit error in a block of memory addresses during the time interval as a random error; and
identifying the occurrence of more than one single-bit error in the block of memory addresses during the time interval as a repeat error.

4. The method of claim 1, further comprising:
mapping the memory address of each detected single-bit error to a corresponding location in an electronic table;
identifying a first occurrence of a single-bit error being mapped to a location in the electronic table during the time interval as a random error; and
identifying a repeated occurrence of a single-bit error being mapped to the location in the electronic table within the time interval as a repeat error.

5. The method of claim 4, further comprising:
applying a hashing function to the memory address of each detected single-bit error to obtain the corresponding location in the electronic table.

6. The method of claim 5, wherein the hashing function maps more than one memory address to each location in the electronic table.

7. The method of claim 4, further comprising:
incrementing a count of random errors in response to each first occurrence of a detected single-bit error having been mapped to the location of the electronic table during the time interval; and
incrementing a count of repeat errors in response to a subsequent occurrence of a detected single-bit error having been mapped to the location of the electronic table during the time interval.

8. The method of claim 1, further comprising:
toggling a signature bit uniquely associated with a block of memory addresses from a first binary value to a second binary value in response to the first occurrence of a single-bit error at that block during the time interval;
incrementing a count of random errors in response to the signature bit having been toggled from the first binary value to the second binary value; and
in response to a subsequent single-bit error at that block during that same time interval, determining from the second binary value of the signature bit that at least one error has previously occurred in that block and incrementing a count of repeat errors.

9. The method of claim 1, further comprising:
separately counting the number of single-bit errors occurring at each of a plurality of blocks, each block including one or more memory addresses;
incrementing a count of random errors in response to each block having one and only one single-bit error during the time interval; and
incrementing a count of repeat errors in response to each block having more than one single-bit error during the time interval.

10. A memory system, comprising:
a memory controller including error detection control logic for detecting single-bit errors in the memory module;
a random-error counter for counting random errors occurring during a time interval;
a repeat-error counter for counting repeat errors occurring during the time interval;
a threshold comparator for comparing the random-error counter against a random-error threshold and for comparing the repeat-error counter against a repeat-error threshold, wherein the repeat-error threshold is smaller than the random-error threshold; and
an alert generator configured to generate an alert in response to the random-error counter reaching the random-error threshold or the repeat-error counter reaching the repeat-error threshold during the time interval.

11. The memory system of claim 10, further comprising:
an electronic table writeable by the memory controller, the memory controller configured for mapping the memory address of each detected single-bit error to a corresponding location in the electronic table;
control logic for identifying a first occurrence of a single-bit error being mapped to a location in the electronic table during the time interval as a random error; and
control logic identifying a repeated occurrence of a single-bit error being mapped to the location in the electronic table within the time interval as a repeat error.

12. The memory system of claim 11, further comprising:
control logic for applying a hashing function to the memory address of each detected single-bit error to obtain the corresponding location in the electronic table.

13. The memory system of claim 12, wherein the hashing function has a reduction ratio of greater than one memory address per location in the electronic table.

14. The memory system of claim 11, further comprising:
control logic for incrementing the random-error counter in response to each first occurrence of a detected single-bit error having been mapped to the location of the electronic table during the time interval; and
control logic for incrementing the repeat-error counter in response to a subsequent occurrence of a detected single-bit error having been mapped to the location during the time interval.

15. The memory system of claim 11, further comprising:
a bit uniquely associated with each location in the electronic table;
control logic for toggling each bit between first and second binary values in response to each occurrence of a detected single-bit error having been mapped to the associated location of the electronic table during the time interval;
control logic for incrementing the random-error counter in response to the bit having been toggled from the first binary value to the second binary value; and
control logic for incrementing the repeat-error counter in response to the bit having been toggled from the second binary value back to the first binary value.

16. A computer program product including computer usable program code embodied on a computer usable storage medium, the computer program product comprising:
computer usable program code for detecting single-bit errors in a memory module;
computer usable program code for identifying each single-bit error as a random error or a repeat error;
computer usable program code for counting each identified random error and each identified repeat error occurring in a time interval; and
computer usable program code for generating an alert in response to a number of identified random errors reaching a random-error threshold or a number of identified repeat errors reaching a repeat-error threshold during the time interval, wherein the repeat-error threshold is lower than the random-error threshold.

17. The computer program product of claim 16, further comprising:
computer usable program code for mapping the memory address of each detected single-bit error to a corresponding location in an electronic table;
computer usable program code for identifying a first occurrence of a single-bit error being mapped to a location in the electronic table during the time interval as a random error; and
computer usable program code for identifying a repeated occurrence of a single-bit error being mapped to the location in the electronic table within the time interval as a repeat error.

18. The computer program product of claim 17, further comprising:
computer usable program code for applying a hashing function to the memory address of each detected single-bit error to obtain the corresponding location in the electronic table.

19. The computer program product of claim 18, wherein the hashing function maps more than one memory address to each location in the electronic table.

20. The computer program product of claim 17, further comprising:
incrementing a count of random errors in response to each first occurrence of a detected single-bit error having been mapped to the location of the electronic table during the time interval; and
incrementing a count of repeat errors in response to a subsequent occurrence of a detected single-bit error having been mapped to the location of the electronic table during the time interval.

\* \* \* \* \*